US006617858B1

(12) United States Patent
Baumgaertl et al.

(10) Patent No.: US 6,617,858 B1
(45) Date of Patent: Sep. 9, 2003

(54) METHOD AND CIRCUIT FOR MEASURING A CURRENT

(75) Inventors: Ulrich Baumgaertl, Berlin (DE); Wolfgang Röhl, Berlin (DE); Holger Hochgraef, Ganzer/Wusterhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/674,882

(22) PCT Filed: May 5, 1999

(86) PCT No.: PCT/DE99/01401

§ 371 (c)(1), (2), (4) Date: Jan. 29, 2001

(87) PCT Pub. No.: WO99/57568

PCT Pub. Date: Nov. 11, 1999

(30) Foreign Application Priority Data

May 7, 1998 (DE) ......................... 198 22 127

(51) Int. Cl.[7] ............................................. G01R 31/08
(52) U.S. Cl. ........................................ 324/522; 324/424
(58) Field of Search ................................ 324/76.15, 424, 324/509, 522; 361/85, 63, 65; 700/59

(56) References Cited

U.S. PATENT DOCUMENTS

| 4,105,778 A | * | 8/1978 | Philipp et al. ............... 702/59 |
| 4,314,301 A | * | 2/1982 | Kondow et al. .............. 361/65 |
| 4,829,298 A | * | 5/1989 | Fernandes ............... 340/870.27 |
| 5,600,526 A | * | 2/1997 | Russell et al. ................. 361/65 |
| 5,841,032 A | * | 11/1998 | Froggatt ....................... 73/597 |
| 5,875,087 A | * | 2/1999 | Spencer et al. ................ 361/87 |
| 5,956,218 A | * | 9/1999 | Berhold ........................ 361/42 |
| 6,175,780 B1 | * | 1/2001 | Engel .......................... 700/293 |
| 6,242,922 B1 | * | 6/2001 | Daum et al. ................. 324/520 |
| 6,295,190 B1 | * | 9/2001 | Rinaldi et al. ............... 361/115 |
| 6,366,076 B1 | * | 4/2002 | Karrer et al. ............ 324/117 R |
| 6,496,342 B1 | * | 12/2002 | Horvath et al. ................ 361/65 |

FOREIGN PATENT DOCUMENTS

| DE | 35 22 739 | 1/1987 |
| DE | 43 23 356 | 9/1994 |

OTHER PUBLICATIONS

Patent Abstracts of Japan, vol. 014, No. 021 (P990), Jan. 17, 1990 & JP 01 263563 A (NEC Corp.), Oct. 20, 1989.

* cited by examiner

Primary Examiner—N. Le
Assistant Examiner—Walter Benson
(74) Attorney, Agent, or Firm—Kenyon & Kenyon

(57) ABSTRACT

A method and circuit arrangement for measuring a current are described, which can be used in electrical engineering to precisely trigger electronic tripping devices in circuit breakers. The current is measured according to magnitude and phase in such a way that only the fundamental wave of the current between precisely determined current zero crossings is sampled at a low sampling rate, and the root mean square is calculated on the basis of the measured phase angle and amplitude. The exact phase angle is measured using a conventional PLL circuit with a downstream zero switch.

8 Claims, 1 Drawing Sheet

METHOD AND CIRCUIT FOR MEASURING A CURRENT

FIELD OF THE INVENTION

The present invention relates to a method and a circuit arrangement for measuring a current according to magnitude and phase angle and can be used, for example, to precisely trigger electronic tripping devices in circuit breakers.

BACKGROUND INFORMATION

Precise compliance with specified tripping characteristics and display of current values is now required for electronic tripping devices in circuit breakers. One conventional method of increasing current measurement precision is to use Rogowski coils with a downstream integrator and normalizing amplifier.

A further conventional method of enhancing precision is to increase the sampling rate of the analog signal and improve the software analysis of the sampled values.

A method for sampling measured quantities and further processing the sampled measured quantities to generate a tripping signal as a function of the magnitude and duration of an overcurrent is described in German Patent No. 35 22 739. According to this method, the sampled measured values are converted to digital values that are weighted and added up according to a specified function. The tripping signal is formed when a cumulative value lies above a specified reference value.

Increasing the sampling rate is a common conventional method. However, this method requires powerful processors that are relatively expensive and consume a great deal of power. The price and power consumption thus limit the ability to increase the sampling rate for economic and technical reasons.

Improving precision through software analysis is based on the fact that a sinusoidal value—the fundamental wave in this is uniquely determined by a pair of values, namely the magnitude and angle. Thus, one sampled value per period would be entirely sufficient to determine the current with an adequate degree of precision in currents without harmonics.

However, these idealized conditions do not exist in practice. Instead, the practical reality is that harmonics do occur in operating currents, and there is the difficulty of precisely determining the phase angle in harmonic currents. For these reasons, current measurement or analysis of this type has not been previously used.

Previously, the root mean square was calculated by measuring the largest possible number of sampled values per period without taking the phase angle into account. The sampled values were squared, added up over a specified period of time, and the average thus formed. An electronic tripping unit for a circuit-breaker, in which a microcomputer is used to determine the root mean squate of the conductor current, is described in German Patent No. 43 23 356.

SUMMARY

An object of the present invention is to provide a method and a circuit arrangement for measuring a current, using simple means to accurately measure the current and enabling precise, reliably, and reproducible tripping of circuit breakers.

One particular advantage of the present invention is that the tripping precision of electronic tripping devices in circuit breakers can be significantly improved at a low cost, using simple means, by measuring the current according to magnitude and phase so that only the fundamental wave of the current is sampled at a low sampling rate between precisely determined current zero crossings, and the root mean square is calculated on the basis of the measured phase angle and the amplitude. To achieve this, a PLL circuit with a downstream zero switch is provided parallel to the input of the A/D converter and to a port input of the microprocessor.

BRIEF DESCRIPTION OF THE DRAWINGS

The FIGURE shows an example embodiment of the present invention.

DETAILED DESCRIPTION

Figure 1:
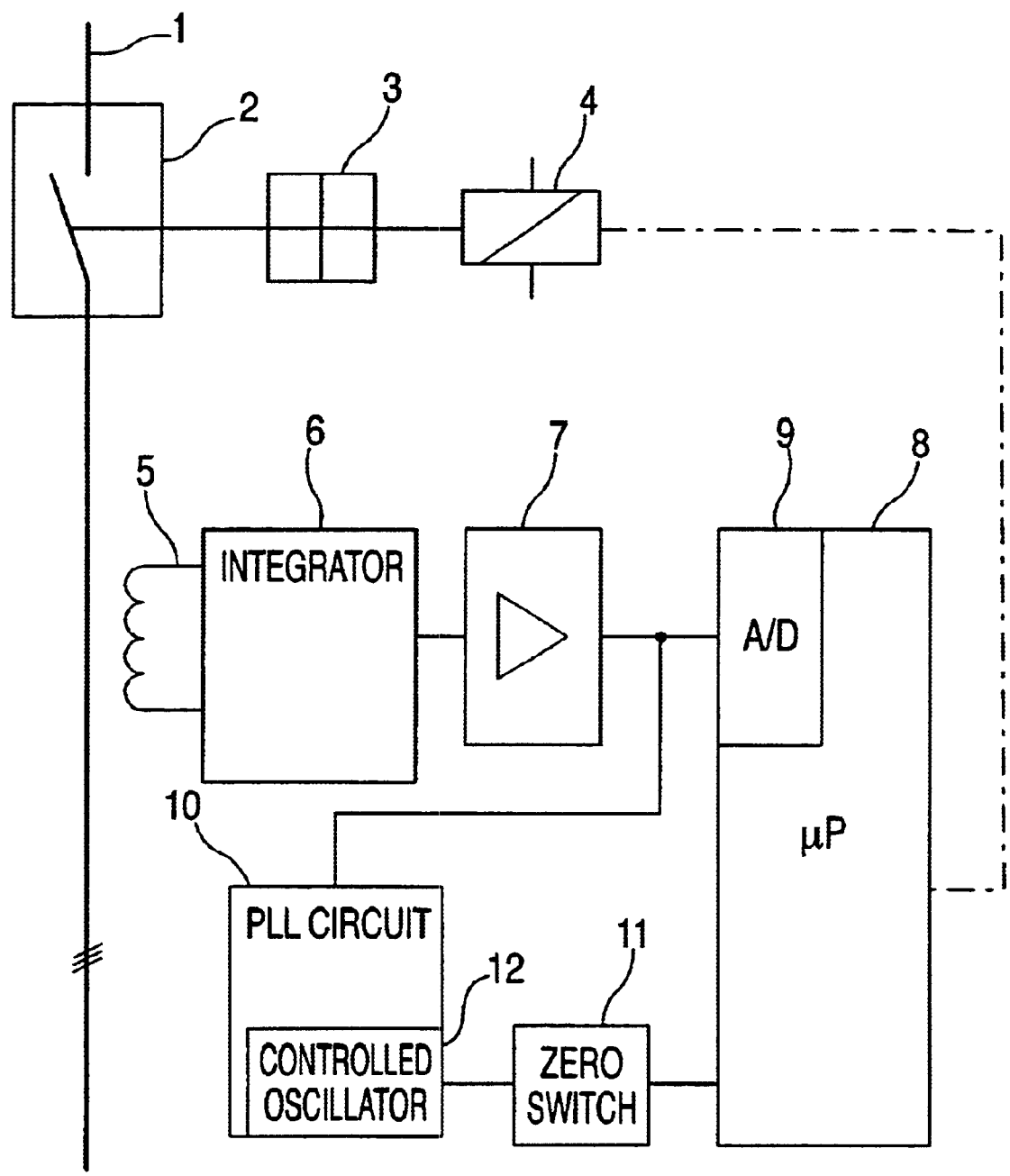

The FIGURE shows a simplified single-pole representation, where reference number 1 designates the main conducting path of a low-voltage circuit-breaker. A switching contact 2 belonging to main conducting path 1 can be latched in the closed switching position in a conventional manner by a latching mechanism 3 and can be released for tripping by a tripping magnet 4. A Rogowski coil 5 that is connected to an integrator 6 and a normalizing amplifier 7 is assigned to main conducting path 1 and used to measure the current. The current signals obtained from this circuit arrangement are processed in a microprocessor 8 after they have been converted by an A/D converter 9 to a form suitable for this purpose.

It is possible to measure the current according to magnitude and phase angle because an exact phase angle can be determined using a conventional PLL (phase-locked loop) circuit 10 with a downstream zero switch 11, as is conventional, for example, in connection with telecommunications engineering. The precise phase angle measurement is achieved, even in currents with a large harmonic component, by connecting PLL circuit 10 parallel to the input of A/D converter 9 and to a port input of microprocessor 8. Controlled oscillator 12 contained in PLL circuit 10 is frequency-limited so that it can respond only to the fundamental wave of the current. Zero switch 11, which emits, precisely at the current zero, an edge change that is detected via a port input of microprocessor 8, is connected downstream from controlled oscillator 12. Using the processor clock as a time scale and the fixed phase relationship between controlled oscillator 12 and primary current, the software can form a precise value pair, composed of the magnitude and phase. The software samples, in a controlled manner, the analog current signal, which can be used to very accurately calculate the root mean square at a low sampling rate.

The present invention is not limited to the example embodiment illustrated here. Instead, it is possible to combine and modify the above-mentioned means and features to implement further embodiments without exceeding the scope of the present invention.

What is claimed is:

1. A method for measuring a current to generate a tripping signal for a circuit breaker, comprising:
   sampling only a fundamental wave of the current between current zero crossings;
   converting the samples to digital values;
   determining a magnitude and phase angle as a function of the digital values;
   determining a root mean square as a function of the determined magnitude and phase angle; and
   generating the tripping signal for the circuit breaker as a function of the root mean square.

2. The method according to claims 1, wherein the sampling step includes sampling at a low sampling rate.

3. The method according to claim 1, further comprising:
   precisely determining the current zero crossings.

4. The method according to claim 1, wherein the sampling step includes controlling the sampling via software control.

5. A circuit for measuring a current to generate a current to generate a tripping signal for a circuit breaker, comprising:
- an electronic tripping device including a switching contact arranged in a main conducting path, a latching mechanism, a tripping magnet, a Rogowski coil, a normalized amplifier and a microprocessor with an A/D converter; and
- a PLL circuit including a downstream zero switch coupled in parallel to an input of the A/D converter and to a port input of the microprocessor, wherein the microprocessor samples a fundamental wave of a current and forms precise value pairs each composed of a magnitude and a phase, the microprocessor determining a root mean square as a function of the value pairs and generating a tripping signal as a function of the root mean square.

6. The circuit according to claim 5, wherein the PLL circuit includes a controlled oscillator that is frequency-limited so that the controlled oscillator responds only to a fundamental wave of the current.

7. A circuit for measuring a current to generate a current to generate a tripping signal for a circuit breaker, comprising:
- an electronic tripping device including a switching contact arranged in a main conducting path, a latching mechanism, a tripping magnet, a Rogowski coil, a normalized amplifier and a microprocessor with an A/D converter; and
- a PLL circuit including a downstream zero switch coupled in parallel to an input of the A/D converter and to a port input of the microprocessor;
- wherein the PLL circuit includes a controlled oscillator that is frequency-limited so that the controlled oscillator responds only to a fundamental wave of the current, and
- wherein the zero switch emits a signal for an edge change precisely at a zero crossing of the fundamental wave.

8. A method for measuring a current to generate a tripping signal for a circuit breaker, comprising:
- emitting a signal for an edge change precisely at a zero crossing of a fundamental wave;
- sampling only the fundamental wave of the current between current zero crossings of the fundamental wave as a function of the emitted signal;
- converting the samples to digital values;
- determining a magnitude and phase angle as a function of the digital values;
- determining a root mean square as a function of the determined magnitude and phase angle; and
- generating the tripping signal for the circuit breaker as a function of the root mean square.

* * * * *